United States Patent
Chen et al.

(10) Patent No.: US 9,412,717 B2
(45) Date of Patent: Aug. 9, 2016

(54) APPARATUS AND METHODS FOR MOLDED UNDERFILLS IN FLIP CHIP PACKAGING

(75) Inventors: Meng-Tse Chen, Changzhi Township (TW); Hsiu-Jen Lin, Zhubei (TW); Chun-Cheng Lin, New Taipei (TW); Wen-Hsiung Lu, Jhonghe (TW); Ming-Da Cheng, Jhubei (TW); Chung-Shi Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 493 days.

(21) Appl. No.: 13/289,719

(22) Filed: Nov. 4, 2011

(65) Prior Publication Data

US 2013/0115735 A1    May 9, 2013

(51) Int. Cl.
| | | |
|---|---|---|
| H01L 21/00 | (2006.01) | |
| H01L 23/00 | (2006.01) | |
| B29C 43/18 | (2006.01) | |
| H01L 21/56 | (2006.01) | |
| B29C 33/68 | (2006.01) | |

(52) U.S. Cl.
CPC ............. *H01L 24/97* (2013.01); *B29C 43/18* (2013.01); *H01L 21/563* (2013.01); *H01L 21/566* (2013.01); *B29C 33/68* (2013.01); *H01L 2224/16225* (2013.01); *H01L 2924/01322* (2013.01); *H01L 2924/181* (2013.01)

(58) Field of Classification Search
CPC ..... H01L 21/56; H01L 21/563; H01L 21/565; H01L 21/566
USPC .................. 438/108, 112; 257/778, 787, 789, 257/E21.503, E21.504
See application file for complete search history.

(56) References Cited

U.S. PATENT DOCUMENTS

| | | | |
|---|---|---|---|
| 5,410,162 A | 4/1995 | Tigelaar et al. | |
| 6,346,433 B1 | 2/2002 | Maeda et al. | |
| 6,379,997 B1 * | 4/2002 | Kawahara et al. | 438/106 |
| 2003/0090040 A1 * | 5/2003 | Silverbrook | B29C 35/0888 |
| | | | 264/492 |
| 2004/0082105 A1 * | 4/2004 | Silverbrook | 438/106 |
| 2004/0212970 A1 * | 10/2004 | Chen | H01L 21/565 |
| | | | 361/764 |
| 2007/0216004 A1 * | 9/2007 | Brunnbauer et al. | 257/678 |
| 2008/0070333 A1 * | 3/2008 | Morita et al. | 438/26 |

(Continued)

FOREIGN PATENT DOCUMENTS

| | | |
|---|---|---|
| KR | 20000076785 | 12/2000 |
| KR | 20080077040 | 8/2008 |
| KR | 20100126910 A | 12/2010 |
| WO | WO 2008-094124 A1 | 8/2008 |

*Primary Examiner* — Khiem D Nguyen
(74) *Attorney, Agent, or Firm* — Slater Matsil, LLP

(57) ABSTRACT

Methods and apparatus for a forming molded underfills. A method is disclosed including loading a flip chip substrate into a selected one of the upper mold chase and lower mold chase of a mold press at a first temperature; positioning a molded underfill material in the at least one of the upper and lower mold chases while maintaining the first temperature which is lower than a melting temperature of the molded underfill material; forming a sealed mold cavity and creating a vacuum in the mold cavity; raising the temperature of the molded underfill material to a second temperature greater than the melting point to cause the molded underfill material to flow over the flip chip substrate forming an underfill layer and forming an overmolded layer; and cooling the flip chip substrate to a third temperature substantially lower than the melting temperature of the molded underfill material. An apparatus is disclosed.

20 Claims, 12 Drawing Sheets

(56) References Cited

U.S. PATENT DOCUMENTS

| | | | |
|---|---|---|---|
| 2009/0221114 A1* | 9/2009 | Xu | 438/113 |
| 2010/0096747 A1* | 4/2010 | Kusano | 257/706 |
| 2011/0318887 A1* | 12/2011 | Ko et al. | 438/126 |
| 2013/0037990 A1* | 2/2013 | Lin | H01L 21/561 264/272.17 |

* cited by examiner

APPARATUS AND METHODS FOR MOLDED UNDERFILLS IN FLIP CHIP PACKAGING

BACKGROUND

A common requirement in current advanced semiconductor processing is for underfill material to be placed around connector terminals that provide physical and electrical connection between an integrated circuit die and a substrate. Ball grid array ("BGA") and flip-chip integrated circuit packages typically include one or more integrated circuit dies mounted to a surface of a substrate. The substrate may further be overmolded to further protect the integrated circuit devices. In a BGA example, the substrate then has, on an opposite surface or in an area designated for it, external ball grid array connectors that provide electrical connectivity to a system board.

In flip chip packaging, after flip chip integrated circuits are mounted on the substrate, an underfill material is provided. The underfill may be provided by a capillary dispensing method, where liquid underfill material flows beneath the dies by capillary action. After the underfill is dispensed and cured, an overmolding process may then be performed and this process provides a mold compound package for the flip chip integrated circuits. This approach requires several steps and is time consuming. The underfill provides a stress relief buffer and protects the connectors and the integrated circuit dies from mechanical stress such as may be caused by thermal cycling.

Recently molded underfill ("MUF") has been used. In MUF processing, the need for a separate overmolding process is eliminated. The MUF material provides both the underfill beneath the integrated circuit dies and surrounding the connectors, and a protective overmolded package. However the known approaches to forming molded underfills in flip chip mounted integrated circuits have several problems. Voids are commonly formed in the MUF material, warpage of the MUF and the substrate are observed, and the known processes for MUF lack good process control and uniformity in the finished devices, resulting in low yields.

BRIEF DESCRIPTION OF THE FIGURES

For a more complete understanding of the present disclosure, and the advantages thereof, reference is now made to the following descriptions taken in conjunction with the accompanying drawings, in which.

The drawings, schematics and diagrams are illustrative and not intended to be limiting, but are examples of embodiments of the disclosure, are simplified for explanatory purposes, and are not drawn to scale.

DETAILED DESCRIPTION

The making and using of the embodiments are discussed in detail below. It should be appreciated, however, that the present disclosure provides many applicable inventive concepts that can be embodied in a wide variety of specific contexts. The specific embodiments discussed are merely illustrative, and do not limit the scope of the disclosure.

Embodiments of the present application which are now described in detail provide novel methods and apparatus for providing a MUF using molding with temperature control during a vacuum assisted molding process. A release film may be used to make release of the finished devices easier. In an embodiment, improved control of the temperature of the mold press and the MUF is used to provide accurate control of the melting and curing of the materials at all stages of the process. Voids and warpage of the MUF material and the substrate observed in the prior known approaches are reduced or eliminated. The method embodiments are implemented without substantial changes to the materials, the substrate or the integrated circuit dies.

Figure 1:
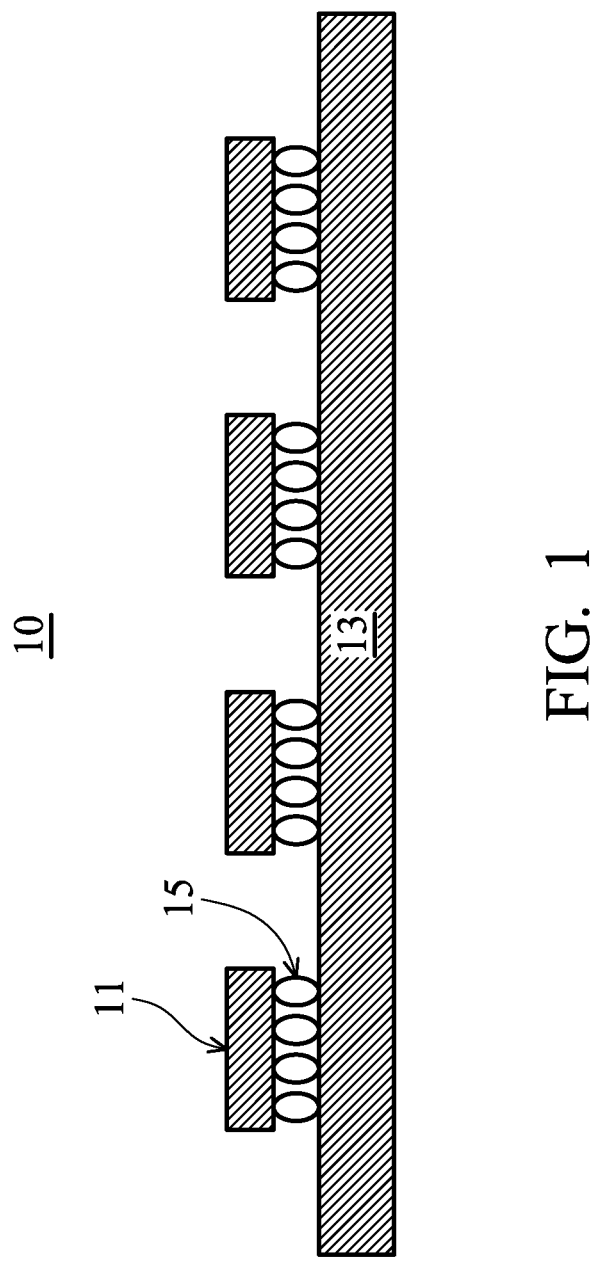
FIG. 1 depicts in a cross-sectional view a flip chip substrate for use with the embodiments.

FIG. 1 depicts in a cross-sectional view an example flip chip substrate for use with the embodiments. Substrate 13 may be, in one non-limiting example, a semiconductor wafer, or a portion of a wafer. The wafer may be silicon, gallium arsenide, silicon on insulator ("SOI") or other similar materials. The wafer may include passive devices such as resistors, capacitors, inductors and the like, or active devices such as transistors. The semiconductor wafer substrate 13 may, in an example embodiment, include additional integrated circuits. However, the substrate 13 may also be of other materials in alternative embodiments. Multiple layer circuit boards may be used. The substrate 13 may be of BT resin, FR4, ceramic, glass, plastic, tape, film, or other supporting materials that may carry the conductive pads or lands needed to receive the connector terminals 15 of the flip chip integrated circuit dies 11.

Integrated circuits 11 are shown in FIG. 1 arranged as flip chip integrated circuits mounted to the substrate 13. In flip chip mounting of integrated circuits, the integrated circuit dies receive connectors such as 15 on the bond pad terminals of the integrated circuit. In a non-limiting example, the connectors may be solder bumps. The solder material may be lead based, or alternatively it may be lead free, such as silver, copper, or tin compositions. The bumps will be eutectics with a common melting point for use in a reflow process. The solder bumps can be plated using electro or electroless plating techniques, or may be formed using screening or jet printing techniques. The connectors 15 may be also be other types such as copper or gold pillars, conductive studs, or C4 columns.

In one example embodiment, solder bumps are used for connectors 15 and the integrated circuits 11 are flipped over, aligned, and placed on the substrate 13 to place the connectors 15 in contact with lands on the substrate 13. The flip chip integrated circuits 11 and the connectors 15 may then be subjected to a thermal solder reflow step to cause the connectors 15 to form electrical and physical connections to the substrate 13. Other methods for assembly of the embodiment of FIG. 1 may be used, however, and the embodiments are not limited by these examples.

The substrate 13 and the integrated circuit dies 11 are now ready for an underfill step. The underfill material is needed between the surfaces of the integrated circuit dies 11 and the surface of substrate 13. The connectors 15 also require stress relief to prevent the connectors from cracking or lifting off the substrate or the integrated circuit dies 11 during operation, as the integrated circuit dies 11 will become quite warm in operation. Thermal expansion and contraction will occur. The underfill material will reduce the mechanical stress that might otherwise cause failures of the connectors 15, or cracking of the integrated circuit dies 11.

Conventional approaches to underfill formation include a capillary dispensing approach, where liquid material is flowed underneath the dies using capillary action. This is referred to as capillary underfill, or "CUF". However, that approach requires several steps. Also the conventional capillary underfill is often followed by an overmolding process to form the final package to protect the backside of the integrated circuit dies 11. This requires additional processing.

Recently, MUF underfill processes have been used. In a known approach, a mold press with upper and lower mold chases is used. The mold press has thermal heating and compression capability. The mold press and is used to mold a MUF material, forming in one process both the underfill layer and the overmolded package. This approach eliminates some of the steps of the prior CUF and overmolding steps, but the conventional known approaches to MUF often result in voids in the underfill, and both MUF and substrate warpage, resulting in device defects and lower than desired yields for finished devices.

Figure 2:
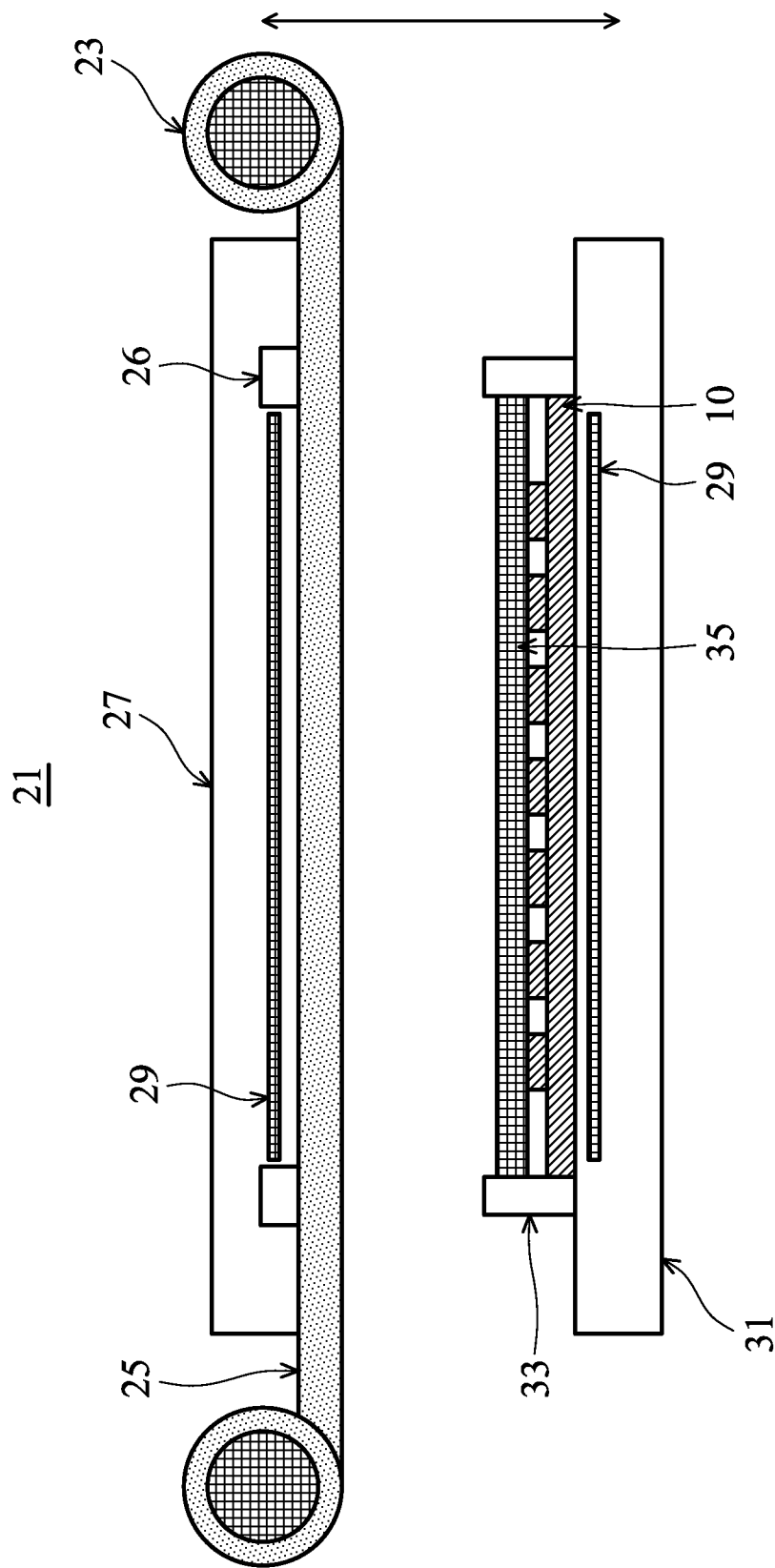
FIG. 2 depicts in a cross-sectional view the mold chases of a mold press and a flip chip substrate in an intermediate processing stage of a method embodiment.

FIG. 2 illustrates in cross-section an embodiment mold press 21 at an intermediate process step for illustrating the method embodiments. In FIG. 2, the flip chip substrate 10 is disposed in a cavity formed by the lower mold chase 31 and the sides 33. The integrated circuits 11 and connectors 15 of flip chip substrate 10 are not shown in detail here, but are arranged as shown in FIG. 1, described above. An upper mold chase 27 is depicted aligned with the lower chase 31 and it has openings 26 corresponding to the sides 33 of the lower chase 31. The mold press 21 is arranged so that the chases 27 and 31 may be moved apart for loading and unloading, and pressed together to form a sealed mold cavity for molding, as is described in detail below. The mold chases 27 and 31 may be formed of any durable resilient material that can withstand the temperature and pressures used. Typically, steel or other alloy metals are used. Coatings such as non-stick coatings may be provided on the mold chases 27 and 31. In FIG. 2, the embodiment is shown in cross-section; the mold cavity may be rectangular, square or circular. For an example using a semiconductor wafer as the substrate, a convenient form factor is to provide a mold press sized to receive an entire wafer for wafer level processing ("WLP"); however, the mold press may process a portion of a wafer. The cavity may be square, rectangular, or otherwise shaped; this shape is not visible in the cross-section of FIG. 2. The mold press 21 may include a hydraulic ram for supplying pressure to force the upper and lower mold chases together during molding.

An optional release film 25 is provided. Mold release films enhance the molding process by ensuring the rapid and easy release of the finished molded devices, and by providing a seal sufficiently tight to enable a vacuum to be formed. The release film 25 is provided on rollers 23 and the film is advanced for each substrate, so that each mold cycle has a fresh release film portion 25. In an alternative embodiment, release films may be provided over both the upper and lower mold chases 27 and 31.

A MUF layer or film 35 is shown loaded in the mold chase 31 over the substrate 10. The MUF layer may be between 10 μms and 500 μms thick, depending on the application, the dies on the substrate, and the material selected for the MUF. In an example illustrative embodiment, the mold compound for the MUF is provided as a room temperature solid material formed to fit the chase 31 within sides 33. In alternative embodiments, the mold compound may be provided as a powder, a liquid, a pellet, a film or in other forms. However, for superior control of the MUF melting and curing processes, the solid film format as shown in FIG. 2 is convenient. The MUF may be of epoxy resin mold compound and may include, as examples, fillers used to adjust the coefficient of thermal expansion ("CTE"), control water absorption, and control elasticity or modulus of the finished mold compound. Plastics, resins, epoxies, adhesives, hardeners, catalysts and release agents are all known ingredients that may be used to give the MUF material the desired melting temperatures ("Tg"), flow and cure properties and provide proper stress release for various substrates and applications.

In an example embodiment, the MUF material may be formed of a soft, pliable lamination layer (pliable at room temperature) that is sufficiently stiff to lie over the integrated circuit dies on the substrate, as shown in FIG. 2. The vacuum process (described below) is not hindered by the MUF, which lies above the dies.

As indicated by the vertical arrow of FIG. 2, the upper and lower mold chases 27 and 31 can open and close for loading and unloading (open for these steps), and for molding and curing (closed for these steps). Thus, one or both of the upper and lower mold chases 27 and 31 may move in the vertical direction to open the cavity and allow for access. In contrast to the conventional approach, in the MUF molding methods of the embodiments, the temperature of the mold press 21, the substrate 10 and MUF 35 is controlled throughout the process.

In the embodiments, at the loading step illustrated in FIG. 2, the mold chases 27 and 31 are at room or ambient temperature, or at least at a temperature well below the melting point of the MUF molding material. For example, the mold chases could be at 25 degrees Celsius; they could be warmer or cooler but at a temperature less than 100 degrees Celsius.

Figure 3:
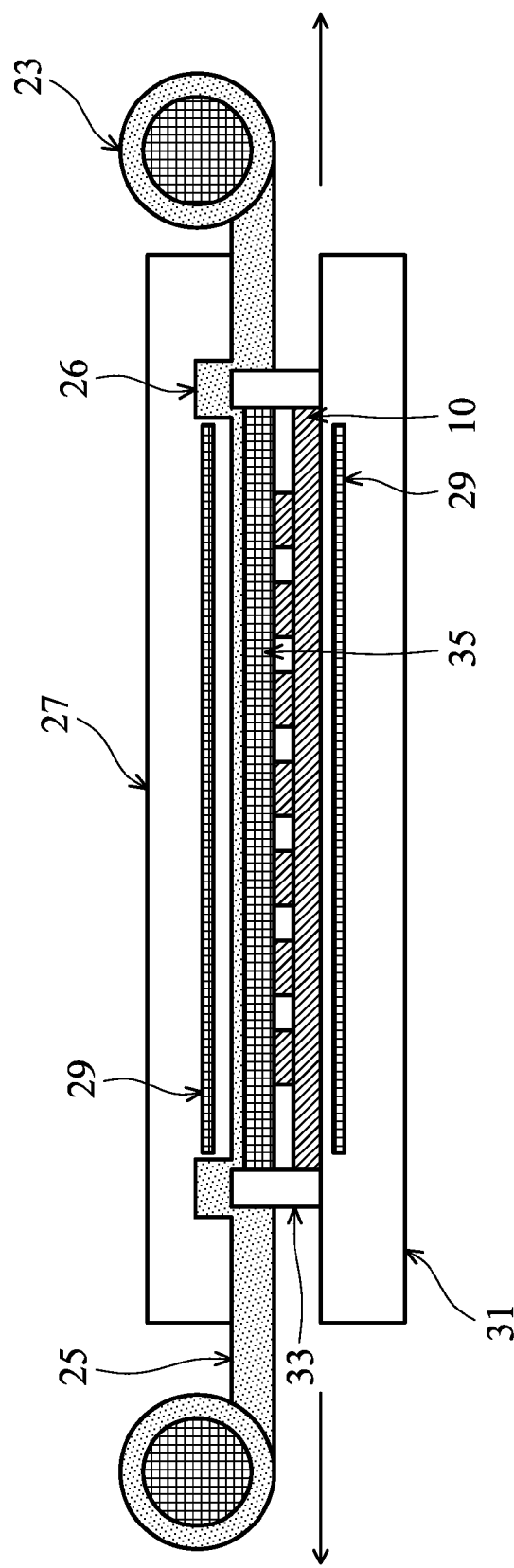
FIG. 3 depicts in a cross-sectional view the mold press of FIG. 3 and the substrate following additional processing steps of the embodiment.

FIG. 3 illustrates the mold press 21 and the flip chip substrate 10 in a vacuum step of the example method embodiment. In FIG. 3, the temperature of the upper and lower mold chases 27 and 31 is still at the starting temperature. The MUF remains solid and above the dies. The mold cavity is closed by bringing the upper and lower chases 27 and 31 into contact with one another, as shown. The release film 25 and the sides 33 of the lower chase 31 form a seal with the upper chase 27, the film is pushed into openings 26 and the cavity is sealed. A vacuum is supplied to remove any atmosphere in the cavity. The vacuum is applied until a high vacuum of at least 1 Torr is achieved, or even less. The vacuum may range from 1 to 0.1 Torr. The vacuum helps reduce or eliminate the formation of voids in the MUF 35 in the subsequent melt and cure processes, described below. At this stage, MUF 35 is still lying over the integrated circuit on flip chip substrate 10; thus, the MUF does not impede the vacuum.

Figure 4:
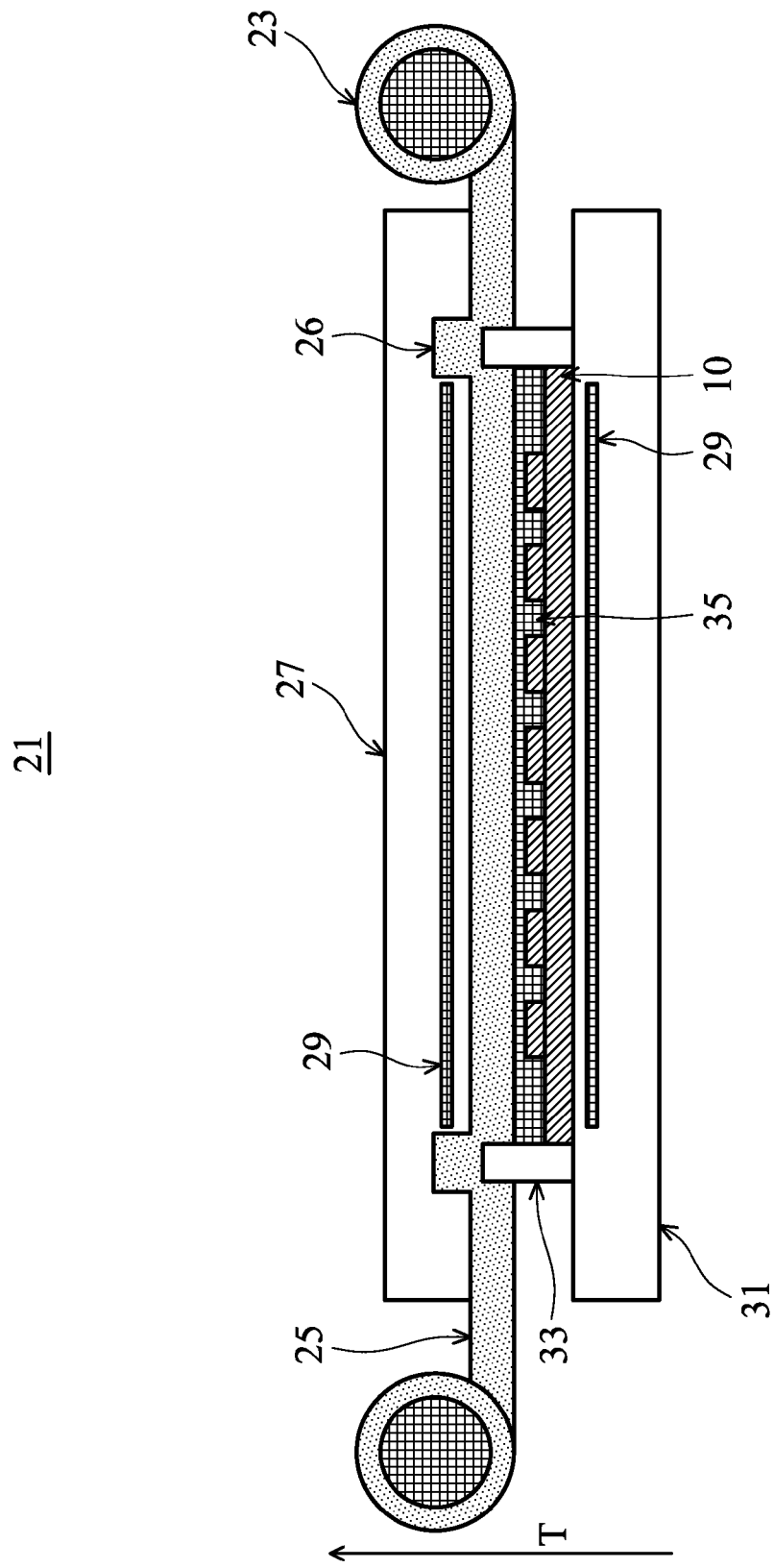
FIG. 4 depicts in a cross-sectional view the mold press of FIG. 3 in an another processing step of the method embodiment for the flip chip substrate.

FIG. 4 illustrates the mold press 21 and the flip chip substrate 10 following additional processing steps. In the method embodiment depicted in FIGS. 2-4, the mold press 21 has heater bars 29 in the upper and lower mold chases 27 and 31. In a MUF melting step, the temperature of the mold chases 27 and 31 is increased and the MUF temperature is raised to a temperature above the melting point of the MUF material. In an example, this temperature could be 120 degrees Celsius and a range of example temperatures can be between 120 degrees Celsius and 135 degrees Celsius, without limiting the embodiments. The melting temperature is sufficient to cause the MUF film 35 to melt and flow into the spaces between the integrated circuit dies and over the surface of the substrate, and to surround the connectors beneath the integrated circuits, to form a void free underfill layer. At the same time, the MUF material forms over the back side of the integrated circuit dies and around the sides of the integrated circuit dies to form an overmolded package layer on substrate 10. The MUF 35 is then subjected to the elevated temperature for an additional time to perform a thermal cure of the MUF material.

During the melt and cure stage, compression may be applied by a hydraulic force or otherwise forcing the chases 27 and 31 closer together to force the MUF material to flow and completely fill the space underneath the integrated circuit dies without voids.

Following the melt and cure steps, in the example method embodiments, a cool down for the mold chases 27 and 31 is performed. In one embodiment, the heater bars 29 are powered off and the mold press 21 is simply allowed to cool. In other embodiments, cooling equipment is added such as a gas or liquid cooling system, or alternatively forced air may be applied, and the mold chases 27 and 31 are cooled more rapidly. The cool down step lowers the temperature of the substrate 10 and the MUF material 35 to a temperature that is well below the melting point of the MUF material. This may be room temperature or another ambient temperature less than 100 degrees Celsius, for example.

Figure 5:
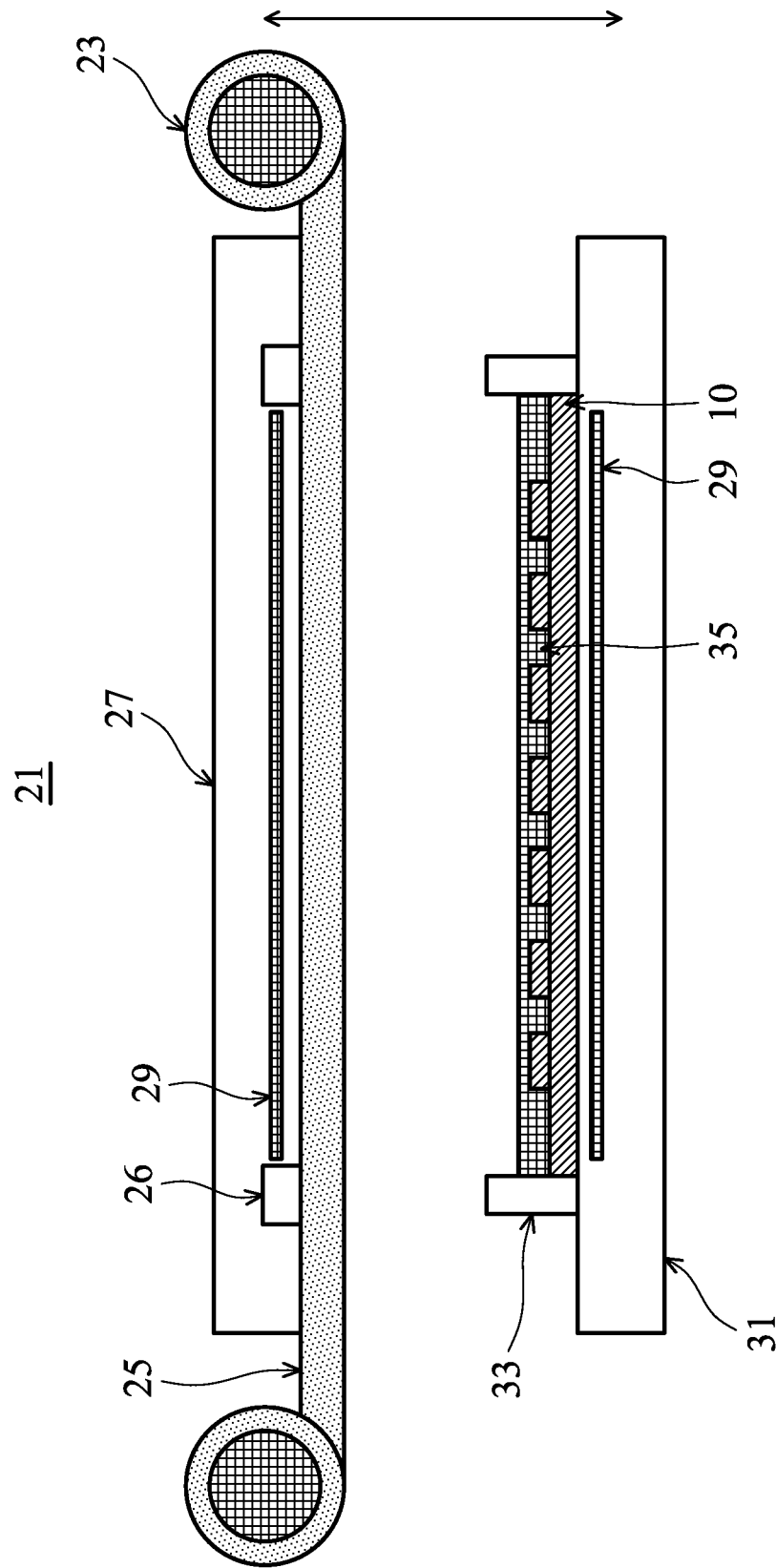
FIG. 5 depicts in another cross-sectional view the mold press and substrate of FIG. 4 following additional processing steps of the method embodiment.

FIG. 5 depicts the mold press 21 following additional steps. After the mold chases 27 and 31, and the substrate 10 reach a desired temperature during the cool down that is well below the MUF melting point, for example room temperature or approximately 25 degrees Celsius, or another specified temperature, the mold cavity is opened by moving one of the chases 27 and 31, and perhaps both, apart from the other, and opening the mold. The release film 25 ensures that the overmolded devices on substrate 10 will easily release from the mold chase 27, and the substrate 10 now includes the completed underfill and overmolded material 35 covering the dies 11 and surrounding the connectors 15. The overmolded flip chip substrate 10 can now be removed from mold press 21 for further processing, such as singulation or wafer sawing or dicing, device marking and tests needed to complete the packaged devices. By opening the mold 21 at a lowered temperature, warpage that often occurs in the conventional MUF assembly approach is avoided. Warpage of the MUF 35 and substrate 10 can cause device cracking, ball cracking, and voids which lead to additional defects. The method embodiments of this application prevent warpage caused by a sudden exposure of a hot overmolded substrate to cooler ambient atmosphere as in the prior known approaches.

Figure 6:
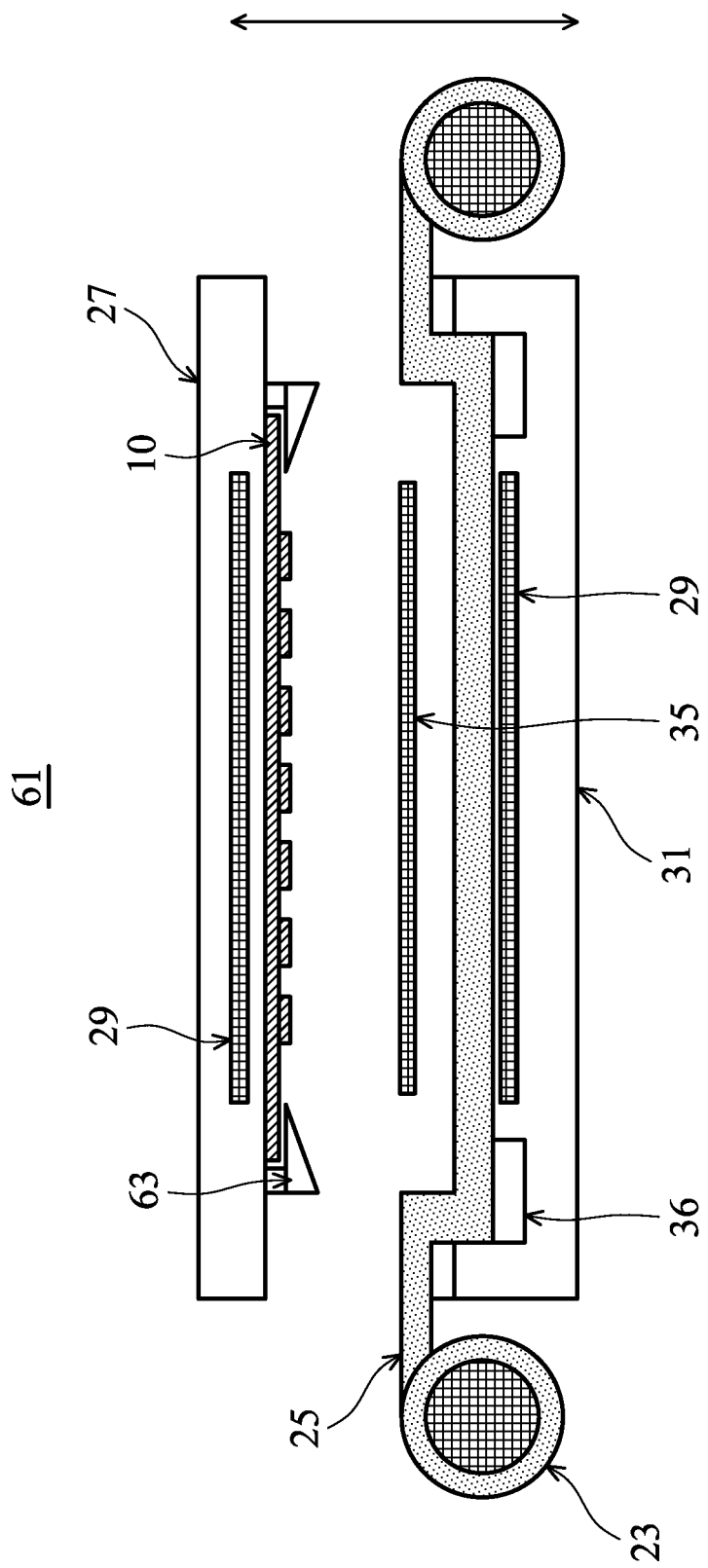
FIG. 6 depicts in a cross-sectional view a mold press and mold chases of an alternative embodiment at an intermediate processing step for a substrate.

FIG. 6 illustrates in a cross-sectional view another example embodiment. A mold press 61 is shown in cross-section, in this example embodiment the substrate 10 is loaded into the upper chase 27 and secured by clamps 63. As shown in FIG. 6, mold press 61 is open for loading. The flip chip substrate 10 includes the integrated circuits 11 and the connectors 15 as shown in FIG. 1, mounted to a substrate 13, now oriented facing downward. Rollers 23 again supply a release film 25 which is shown covering the lower mold chase 31. A MUF film or layer 35 is depicted loaded into the lower chase 31 and lying over the release film 25. Openings 36 in the lower chase 31 correspond to the clamps 63 and provide a seal for the closed mold. Heater bars 29 are provided to enable heating the upper and lower mold chases 27 and 31 at a later processing step, as is described below. At the intermediate loading process step illustrated in FIG. 6, the substrate 10 and the mold chases 27 and 31 are at a temperature substantially lower than the melting temperature of MUF 35; for example, room temperature or approximately 25 degrees Celsius.

Figure 7:
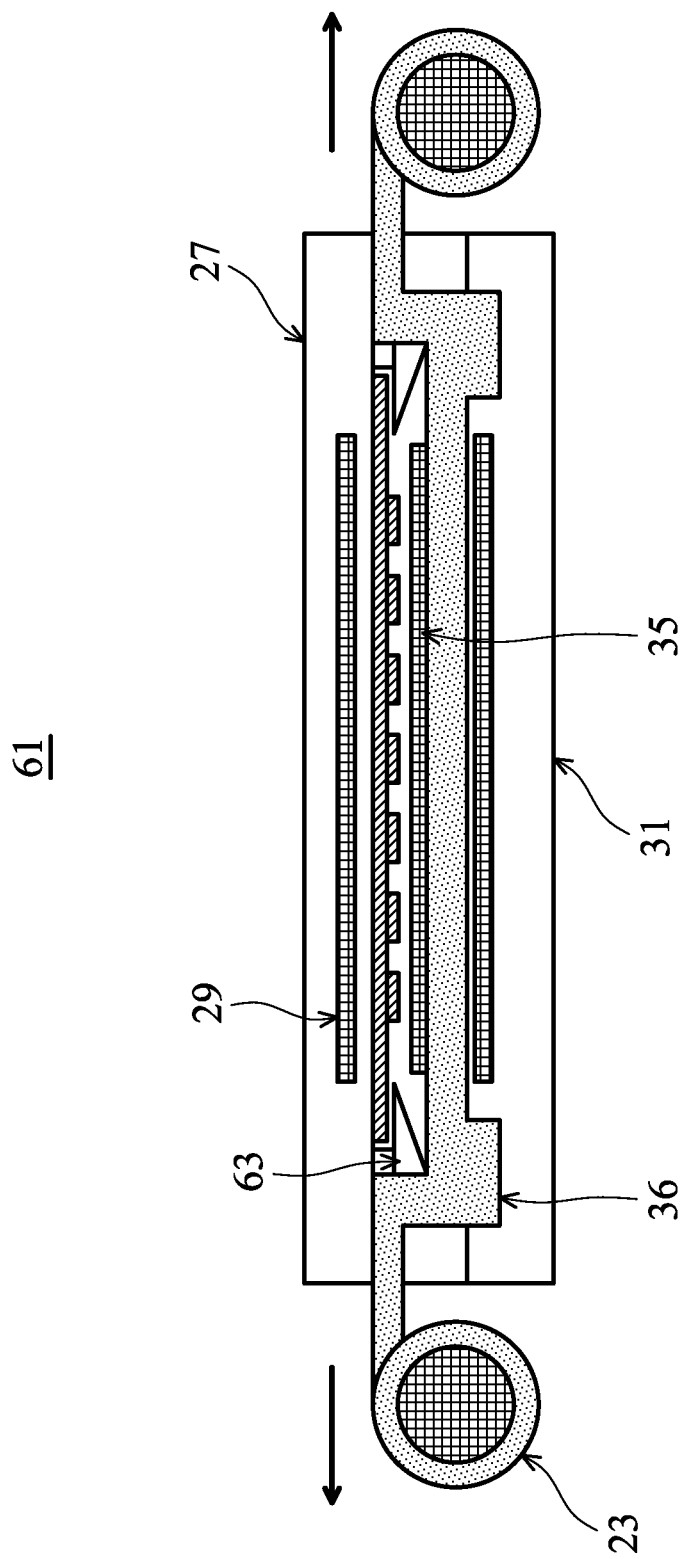
FIG. 7 depicts in a cross-sectional view the mold press and substrate of FIG. 6 following an additional processing step of the method embodiment.

FIG. 7 depicts, in cross-section, the mold press 61 of FIG. 6 and substrate 10 following additional processing steps. In FIG. 7 a vacuum (indicated by the horizontal arrows in the figure) is applied after the mold chases 27 and 31 are closed and the mold is sealed by the release film 25 and the clamps 63 extending into the openings 36 of the lower chase 31. The vacuum is applied until a very low level is reached, approximately 1 Torr or less, to remove any excess atmosphere from the mold. During the vacuum step, the substrate 10 and the mold chases 27 and 31 remain cool or at ambient temperature. Thus, the MUF 35 does not begin melting during the loading or vacuum steps. This method embodiment provides a novel approach in sharp contrast to the known processes, which are typically performed in a hot mold press, where the MUF material begins melting immediately on loading into the mold, which allows voids to form. The use of the embodiments of this application reduces or eliminates these voids by controlling the temperature at each step.

Figure 8:
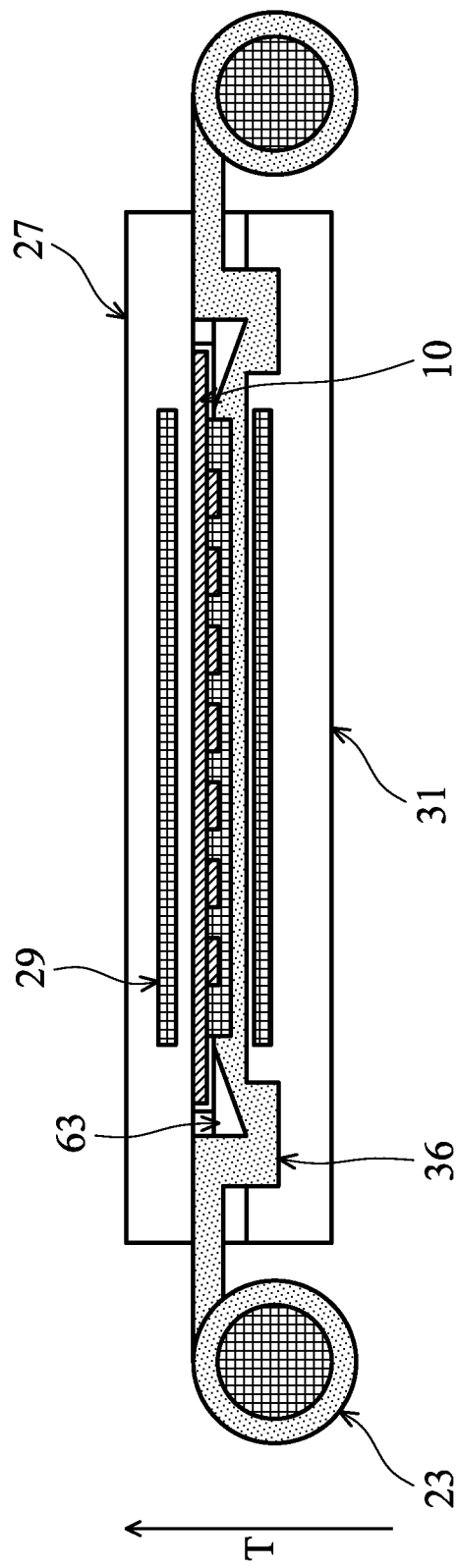
FIG. 8 depicts in another cross-sectional view the mold press and substrate of FIG. 7 following additional process steps of the method embodiment.

FIG. 8 depicts the mold press 61 and substrate 10 following another process step. In FIG. 8, the temperature is increased to melt and cure the MUF material 35. Compression may also be applied by forcing the two chases 27 and 31 together while the MUF 35 melts to force the MUF 35 to surround and flow beneath the integrated circuit dies 11 on the substrate 10. The temperature for the process is selected to be greater than a melting point for the particular MUF material 35 that is used. The temperature may range from 120 to 130 degrees Celsius, for a non-limiting example. After the MUF 35 melts, it is maintained at an elevated temperature to cure the MUF material 35 and form the overmolded package over the substrate 10, providing a protective package for the integrated circuits.

Following the melt and cure stages, the mold press 61 including the chases 27 and 31 and the substrate 10 now including the MUF material 35 are allowed to cool. In one embodiment, natural cooling can be used, although for throughput reasons, a cooling mechanism such as forced air, gas or liquid cooling in the mold press 61 may be used. Once the substrate 10 has cooled to a temperature well below the melting temperature for the MUF 35, for example, room temperature or approximately 25 degrees Celsius, the mold press 61 may be opened for unloading.

Figure 9:
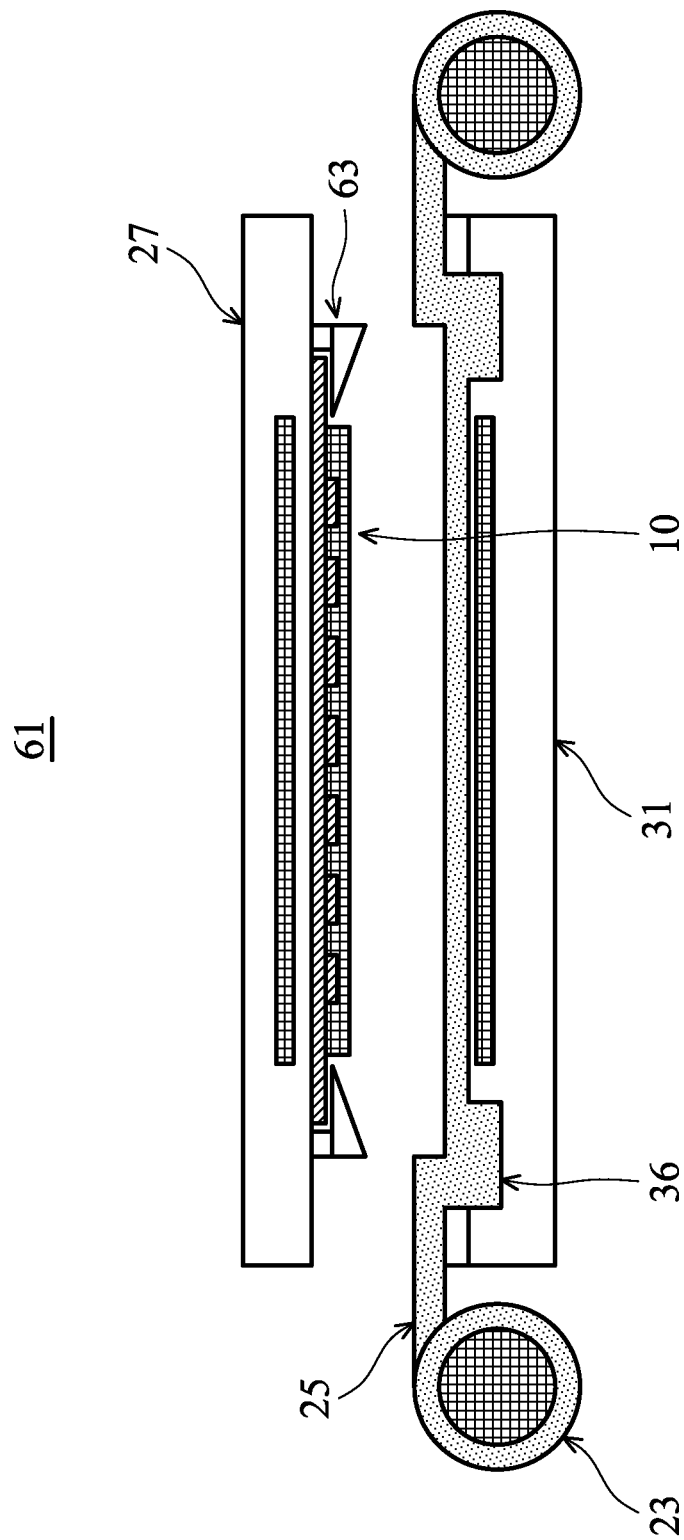
FIG. 9 depicts in another cross-sectional view the mold press and substrate of FIG. 8 following additional process steps of the method embodiment.

FIG. 9 depicts the mold press 61 and substrate 10 at the unloading stage. MUF 35 now forms an overmolded package and the underfill material for integrated circuits mounted on the flip chip substrate 10. The release film 25 ensures that the substrate 10 may be easily removed from the mold press 61. The rollers 23 can then be used to advance the release film 25 so that for the next load cycle, a fresh film is used. The clamps 63 can be opened to remove the substrate 10 from the upper mold chase 27.

In the method embodiments described above with respect to FIGS. 2-9, conventional mold chase materials such as steel or other metals can be used. These materials are thermally conductive, so heater bars and cooling channels may be used to control and vary the temperature of the chases 27 and 31, and thus heat and cool the substrate 10 and the MUF 35.

Figure 10:
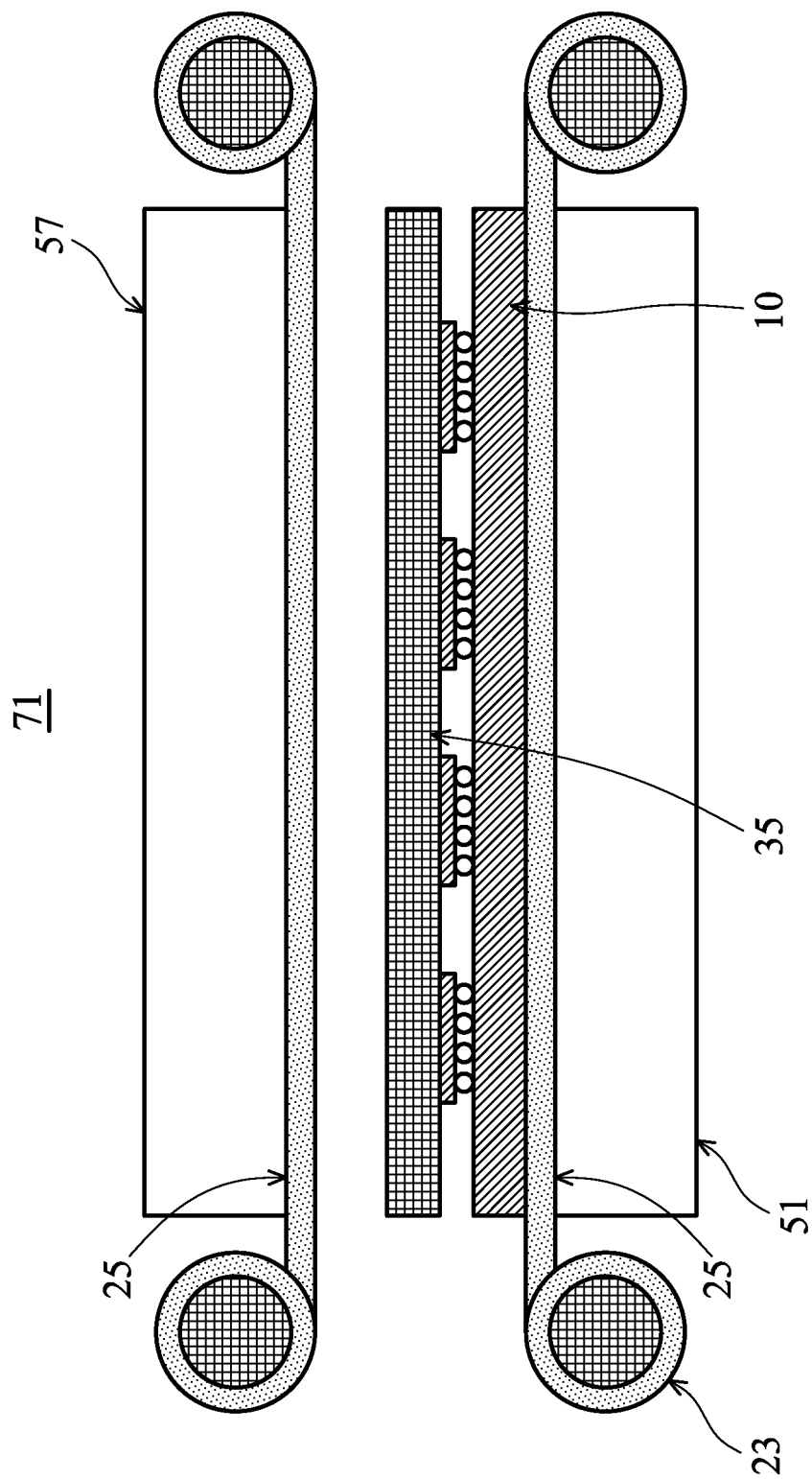
FIG. 10 depicts in a cross-sectional view an alternative apparatus embodiment mold press and a substrate in an intermediate process step.

FIG. 10 depicts an alternative apparatus embodiment that may be used. In FIG. 10, a mold press 71 is shown in cross-section. The mold press 71 has an upper chase 57 and a lower chase 51. The mold press 71 is shown in the open position in FIG. 10. Again, release film 25 is provided, in this embodiment, over both the upper and lower chases 57 and 51. A substrate 10, such as illustrated in FIG. 1, is shown loaded over the lower chase 51 and overlying the release film 25. As described above, this may be a semiconductor wafer with integrated circuits flip chip mounted to it, or it may be another flip chip substrate material. A layer of MUF material 35 is depicted disposed over the integrated circuits and is shown solid at the initial temperature, such as room temperature. The MUF 35 may be provided in other forms, but the solid or pliable solid layer or film 35 is convenient.

In this embodiment, the upper and lower mold chases 57 and 51 are formed of a transparent material that passes infrared radiation. For example, the chases 57 and 51 may be formed of a polycarbonate. Reinforced or "bulletproof" glass may be used; this material may include polycarbonate, thermoplastics, layers of laminated glass, or combinations of these. Other materials could be used so long as the materials are transparent to IR radiation. The chase material will pass the infrared radiation through without substantial heating of the chase material. This allows the heating processes to be limited to the MUF material 35 and the substrate 10, reducing the amount of heating and cooling time required, and thus increasing throughput.

Figure 11:
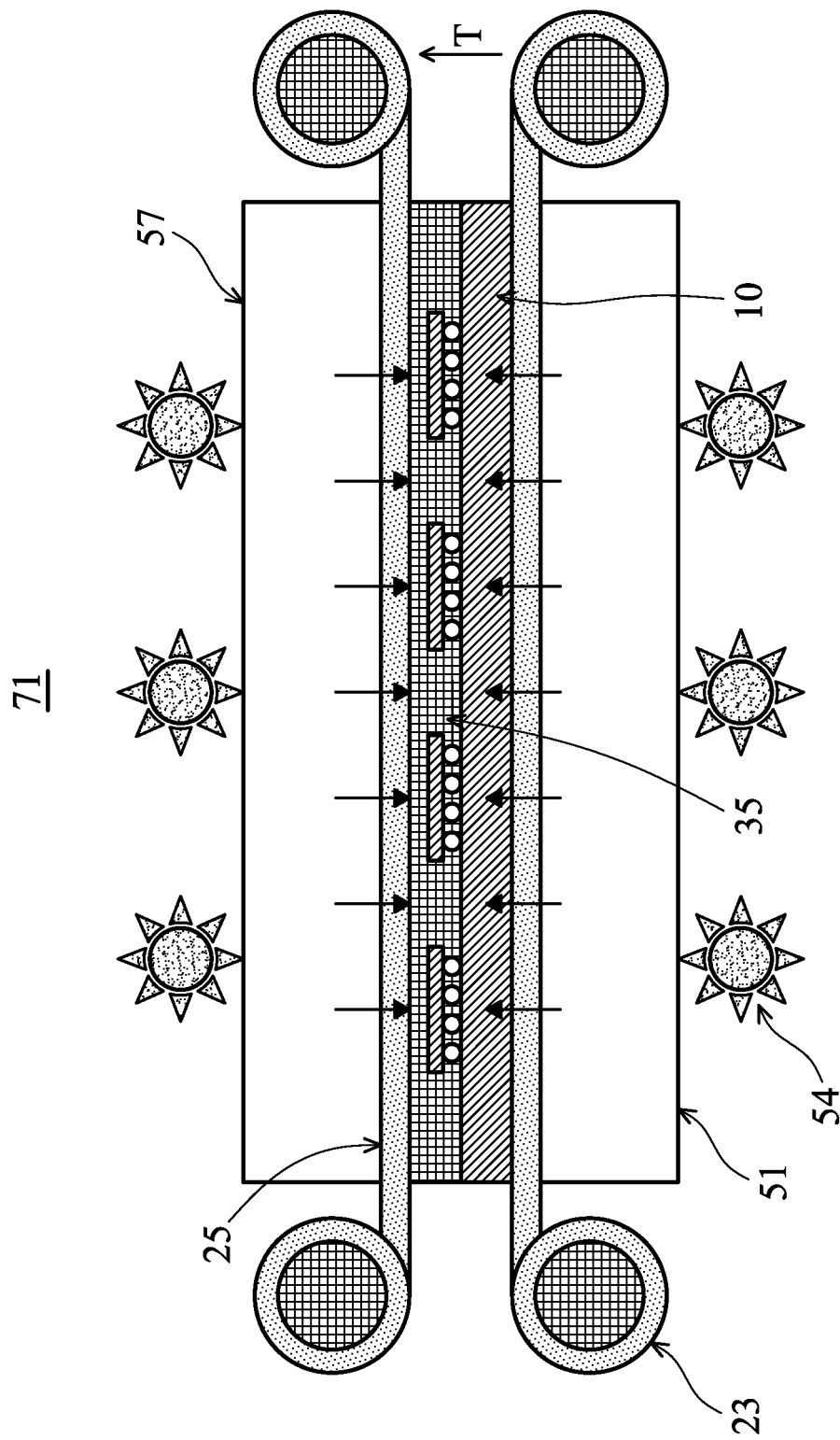
FIG. 11 depicts in a cross-sectional view the mold press of FIG. 10 following additional processing steps.

FIG. 11 depicts in a cross-sectional view the mold press 71 of FIG. 10 in the MUF melting step. After the chases 57 and 51 are loaded and closed, a vacuum is created in the mold cavity and a strong vacuum is established, lower than 1 Torr, and in a range between 1 to 0.1 Torr. Then, the MUF melting is done. In this example embodiment method, the MUF is heated by applying infrared radiation from IR sources 54 located above and below the mold chases 57 and 51. Because the IR transparent mold chase materials and the release film 25 pass the IR without heating, the heating is now localized to the substrate 10 and the MUF 35. The temperature of the MUF is increased to a temperature greater than the melting point for the material. The MUF then melts and flows into the areas between the integrated circuits on substrate 10, and flows underneath the integrated circuits to form an underfill layer as before, and the remaining material of the MUF forms an overmolded layer to protect the integrated circuits on substrate 10. The increased temperature is maintained for a time sufficient to cure the MUF material. As shown by the vertical arrows in FIG. 11, pressure may be applied by the mold press 71 during the MUF melting step to force the MUF material to flow into the spaces beneath the integrated circuits on the substrate 10, and thus completely fill the spaces without voids.

The remaining steps in this method embodiment are similar to those described above, a cooling step is performed with the mold press 71 closed and the substrate is cooled to a temperature substantially lower than the melting point of the MUF 35; for example, room temperature. Only then is the mold press 71 opened, so that the substrate and MUF 35 are cool when it is opened, and no warpage occurs. The release film 25 over the upper and lower chases 57 and 51 allow the substrate 10 to be easily removed from the mold press 71. The cooling may be done by simply turning off the IR sources 54 and allowing the substrate to cool (the mold press 71 will not be heated, as it passes the infrared energy.) The cooling may be shortened in time by using forced air, liquid, or gas cooling of the mold press 71.

Figure 12:
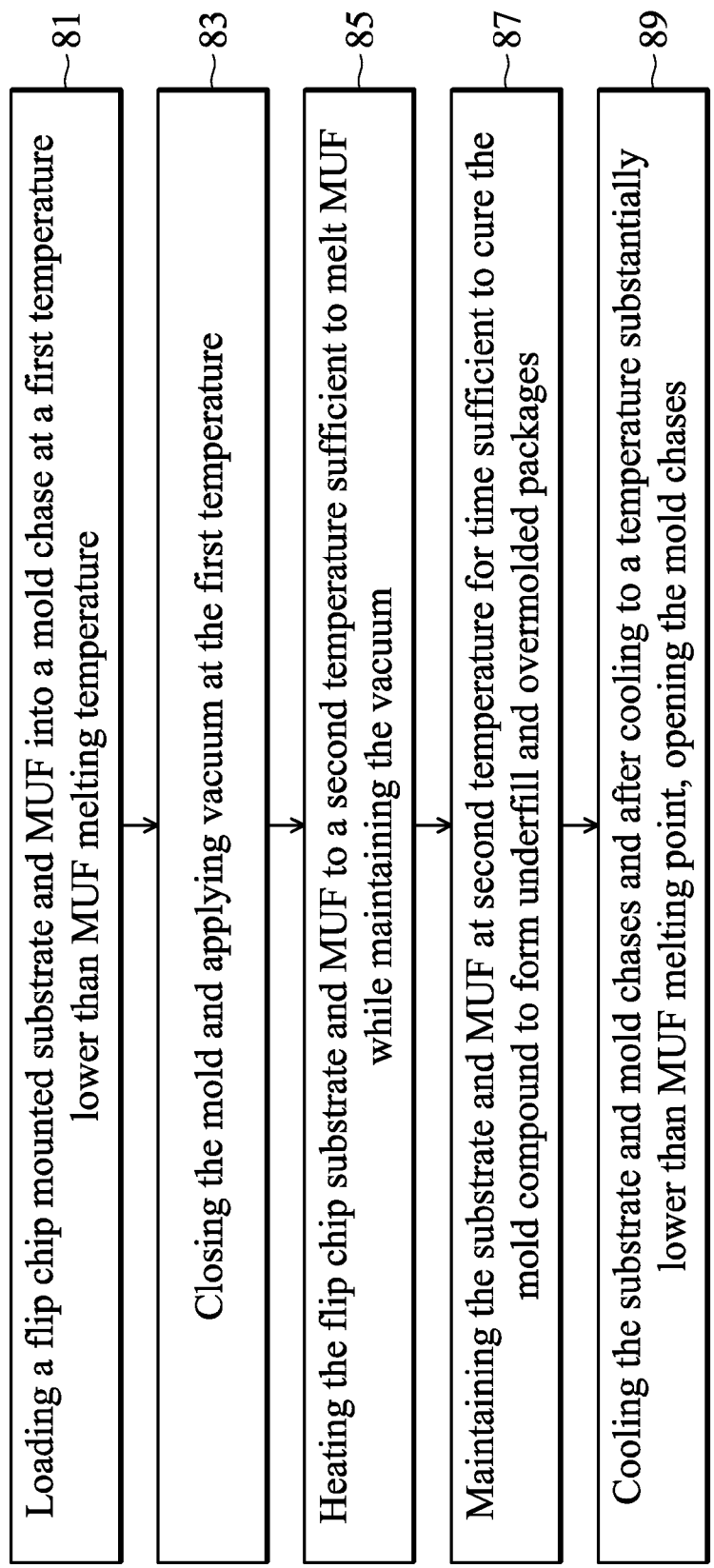
FIG. 12 depicts in a flow diagram an example method embodiment.

FIG. 12 depicts example method embodiment steps in a flow diagram. At step 81, the mold is opened at a first temperature, and the substrate is loaded into the mold. MUF material is loaded into the mold at the first temperature, which may be room temperature or another temperature lower than the MUF melting point. In step 83, the mold chases are closed together and the vacuum is applied to create a vacuum within the mold cavity, still the temperature is at the first temperature. In step 85, the substrate and MUF material are heated to a temperature over the melting point of the MUF material. In the embodiments using opaque mold chase materials, this may be done using heater bars in the upper and lower mold chases. In the embodiments using the IR transparent mold chase materials, IR energy may be applied to locally heat the MUF and the substrate to the second temperature.

Next, the method transitions to step 87, where the MUF is cured and forms the underfill and overmolded packages. At step 89, the substrate is cooled to the first temperature or a temperature substantially lower than the melting point of the MUF, prior to the opening of the mold press, so that no warpage occurs. Finally, the mold chases are opened for unloading the substrate. Further processing such as dicing, marking, and testing may then be performed on the overmolded devices.

Use of the embodiment methods control the MUF and flip chip substrate temperature profile throughout the molded underfill process. By maintaining the temperature at a lower temperature during loading, and during the vacuum stage, the molded underfill remains solid and only begins melting when the temperature is increased during the MUF melting and curing stage. In contrast to the prior approaches known for MUF processing, voids are prevented by keeping the MUF material from melting until after the loading is completed and the vacuum is provided in the mold cavity. Further, by cooling the substrate and MUF prior to opening the mold after the curing step, the wafer warpage problems observed in the prior approaches are reduced or eliminated. The embodiment methods increase yield and improve the results obtained without adding costs or the need for additional materials. The embodiment methods are particularly advantageous for large wafer substrates with fine pitch flip chip mounted devices where voids in the underfill were frequently observed when the prior art MUF processes were used.

In a method embodiment, the method includes loading a flip chip substrate comprising at least one flip chip mounted integrated circuit on the substrate into a selected one of the upper mold chase and lower mold chase of a mold press at a first temperature; positioning a molded underfill material in the at least one of the upper and lower mold chases overlying the flip chip substrate and the at least one integrated circuit, while maintaining the upper and lower mold chases at a first temperature which is lower than a melting temperature of the molded underfill material; closing the upper and lower mold chases together to form a sealed mold cavity and creating a vacuum in the mold cavity; raising the temperature of the molded underfill material to a second temperature greater than the melting point of the molded underfill material to cause the molded underfill material to flow over the flip chip substrate and beneath the at least one flip chip mounted integrated circuit, forming an underfill layer and forming an overmolded layer; cooling the flip chip substrate and the mold cavity to a third temperature substantially lower than the melting temperature of the molded underfill material; and subsequently opening the upper and lower mold chases to expose the flip chip substrate for unloading.

In another method embodiment, the method above further includes loading the flip chip substrate into the lower mold chase. In an alternative, the above method is performed and includes loading the flip chip substrate into the upper mold chase. In yet another method embodiment, the above method is performed and includes activating heaters in the upper and lower mold chases of the mold press, the upper and lower mold chases being thermally conductive. In yet another embodiment, the above methods include raising the temperature further comprises activating infrared sources disposed over the upper mold chase and below the lower mold chase of the mold press, the upper and lower mold chases being transparent to infrared radiation. In still another embodiment, the above methods include providing mold release film over a portion of at least one of the upper and lower mold chases. In still another method embodiment, in the above methods the first temperature is approximately 25 degrees Celsius. In a further embodiment, in the above methods the third temperature is approximately 25 degrees Celsius.

In a further alternative embodiment, in the above methods, the second temperature is between 120 and 135 degrees Celsius. In still another embodiment, the molded underfill material is an epoxy resin that is a solid at room temperature. In yet another alternative embodiment, in the above methods, the substrate includes a semiconductor substrate.

In an apparatus embodiment, a mold press is provided having an upper mold chase and a lower mold chase, the upper and lower mold chase comprising material that is transparent to infrared radiation, and infrared lamps are arranged to supply infrared radiation to the upper and lower mold chases. In a further embodiment, release film supplies are adapted to provide a release film over at least one of the upper and lower mold chases of the mold press. In yet another embodiment, the apparatus includes a vacuum supply adapted to provide a vacuum within a cavity formed by closing the upper and lower mold chases together. In still another embodiment, the apparatus includes a hydraulic ram adapted to compress the upper and lower mold chases together. In yet another embodiment, the upper and lower mold chases further comprise polycarbonate.

Another method embodiment includes loading a semiconductor substrate comprising a plurality of flip chip mounted integrated circuits mounted thereon into one of an upper mold chase and a lower mold chase in a mold press, the upper and lower mold chases at a first temperature; loading a molded underfill layer into one of the upper and lower mold chase while the upper and lower mold chases are maintained at the first temperature, the molded underfill layer being a solid at the first temperature, and overlying the plurality of flip chip mounted integrated circuits; closing the upper and lower mold chases of the mold press to form a sealed cavity containing the semiconductor substrate and the molded underfill layer; supplying a vacuum to the sealed cavity to create a vacuum of less than approximately 1 Torr while maintaining the semiconductor substrate and the molded underfill layer at the first temperature; heating the semiconductor substrate and the molded underfill layer to a second temperature greater than the melting temperature of the molded underfill layer so that the molded underfill layer flows over the semiconductor substrate and forms an underfill beneath the plurality of flip chip mounted integrated circuits, while forming an overmolded package layer over the flip chip mounted integrated circuits; cooling the semiconductor substrate to a third temperature that is substantially lower than the melting temperature of the molded underfill layer; and opening the upper and lower mold chase for unloading the mold press.

In a further method embodiment, the above method is performed wherein heating the semiconductor substrate comprises applying heat to the upper and lower mold chases, the upper and lower mold chases being formed of thermally conductive material. In an alternative embodiment, the above method is performed wherein heating the semiconductor substrate comprises applying infrared radiation to the upper and lower mold chases, the upper and lower mold chases being formed of infrared transparent material. In still another embodiment, the above method is performed wherein cooling the semiconductor substrate further comprises applying cooling using one selected from the group consisting essentially of gas cooling, liquid cooling, and forced air cooling.

The scope of the present application is not intended to be limited to the particular illustrative embodiments of the structures, methods and steps described in the specification. As one of ordinary skill in the art will readily appreciate from the disclosure of the present disclosure, processes, or steps, presently existing or later to be developed, that perform substantially the same function or achieve substantially the same result as the corresponding embodiments described herein may be utilized according to the present disclosure. Accordingly, the appended claims are intended to include within their scope such processes or steps.

What is claimed is:

1. A method, comprising:
    loading a flip chip substrate comprising at least one flip chip mounted integrated circuit on the flip chip substrate into a selected one of an upper mold chase and a lower mold chase of a mold press at a first temperature, the at least one flip chip mounted integrated circuit electrically coupled to the flip chip substrate;
    positioning a molded underfill material in at least one of the upper and lower mold chases overlying the flip chip substrate and the at least one flip chip mounted integrated circuit, the molded underfill material contacting the at least one flip chip mounted integrated circuit, while maintaining the upper and lower mold chases at the first temperature which is lower than a melting temperature of the molded underfill material;
    after the positioning the molded underfill material, closing the upper and lower mold chases together to form a sealed mold cavity and after closing, removing air from the mold cavity to create a vacuum in the mold cavity;
    after the removing air from the mold cavity, raising the temperature of the molded underfill material to a second temperature greater than the melting temperature of the molded underfill material to cause the molded underfill material to flow over the flip chip substrate and beneath the at least one flip chip mounted integrated circuit, forming an underfill layer and forming an overmolded layer;
    cooling the flip chip substrate and the mold cavity to a third temperature substantially lower than the melting temperature of the molded underfill material; and
    subsequently opening the upper and lower mold chases to expose the flip chip substrate for unloading.

2. The method of claim 1, wherein loading the flip chip substrate comprises loading the flip chip substrate into the lower mold chase.

3. The method of claim 1, wherein loading the flip chip substrate comprises loading the flip chip substrate into the upper mold chase.

4. The method of claim 1, wherein raising the temperature further comprises activating heaters in the upper and lower mold chases of the mold press, the upper and lower mold chases being thermally conductive.

5. The method of claim 1, wherein raising the temperature further comprises activating infrared sources disposed over the upper mold chase and below the lower mold chase of the mold press, the upper and lower mold chases being transparent to infrared radiation.

6. The method of claim 1, wherein loading the flip chip substrate further comprises providing a mold release film over a portion of at least one of the upper and lower mold chases.

7. The method of claim 1, wherein the first temperature is approximately 25 degrees Celsius.

8. The method of claim 1, wherein the third temperature is approximately 25 degrees Celsius.

9. The method of claim 1, wherein the second temperature is between 125 and 135 degrees Celsius.

10. The method of claim 1, wherein the molded underfill material is an epoxy resin that is a solid at room temperature.

11. The method of claim 1, wherein loading the flip chip substrate further comprises loading a semiconductor substrate.

12. A method, comprising:
loading a semiconductor substrate comprising a plurality of flip chip mounted integrated circuits electrically connected to the semiconductor substrate into one of an upper mold chase and a lower mold chase in a mold press, the upper and lower mold chases at a first temperature;
loading a molded underfill layer into one of the upper and lower mold chases while the upper and lower mold chases are maintained at the first temperature lower than a melting temperature of the molded underfill layer, the molded underfill layer being a solid at the first temperature, and the molded underfill layer overlying and contacting the plurality of flip chip mounted integrated circuits;
closing the upper and lower mold chases of the mold press to form a sealed cavity containing the semiconductor substrate and the molded underfill layer;
supplying a vacuum to remove air from the sealed cavity to create a vacuum of less than approximately 1 Torr while maintaining the semiconductor substrate and the molded underfill layer at the first temperature;
after the supplying the vacuum, heating the semiconductor substrate and the molded underfill layer to a second temperature greater than the melting temperature of the molded underfill layer so that the molded underfill layer flows over the semiconductor substrate and forms an underfill beneath the plurality of flip chip mounted integrated circuits, while forming an overmolded package layer over the flip chip mounted integrated circuits;
cooling the semiconductor substrate to a third temperature that is substantially lower than the melting temperature of the molded underfill layer; and
opening the upper and lower mold chases for unloading the mold press.

13. The method of claim 12, wherein heating the semiconductor substrate comprises applying heat to the upper and lower mold chases, the upper and lower mold chases being formed of thermally conductive material.

14. The method of claim 12, wherein heating the semiconductor substrate comprises applying infrared radiation to the upper and lower mold chases, the upper and lower mold chases being formed of infrared transparent material.

15. The method of claim 12, wherein cooling the semiconductor substrate further comprises applying cooling using one selected from the group consisting essentially of gas cooling, liquid cooling, and forced air cooling.

16. The method of claim 12, wherein the opening the upper and lower mold chases is performed after the cooling the semiconductor substrate to a third temperature.

17. A method, comprising:
loading a substrate with at least one flip chip mounted integrated circuit into an upper mold chase or a lower mold chase of a mold press, the upper and lower mold chases being transparent to infrared (IR) radiation;
loading a molded underfill material in the upper mold chase or the lower mold chase, while maintaining the upper and lower mold chases at a first temperature, wherein the molded underfill material is formed of a soft lamination layer that is pliable and sufficiently stiff to lie over the at least one flip chip mounted integrated circuit on the substrate at room temperature;
closing the upper and lower mold chases together to form a sealed mold cavity;
after forming the sealed mold cavity, removing air from the sealed mold cavity to form a vacuum;
after the removing air from the sealed mold cavity, sending IR radiation from outside the mold press through the IR transparent upper and lower mold chases to heat the molded underfill material to a second temperature greater than a melting point of the molded underfill material to cause the molded underfill material to flow, wherein the molded underfill material flows over, around, and underneath the at least one flip chip mounted integrated circuit;
cooling the substrate and the mold cavity to a third temperature lower than the melting point of the molded underfill material; and
unloading the substrate from the mold press.

18. The method of claim 17, further comprising forming a release film within the upper mold chase or the lower mold chase or both.

19. The method of claim 17, wherein closing the upper and lower mold chases further comprises compressing the upper and lower mold chases together.

20. The method of claim 18, wherein forming the release film further comprises forming a new release film for each mold cycle.

* * * * *